United States Patent [19]

Hanson et al.

[11] Patent Number: 5,620,558
[45] Date of Patent: Apr. 15, 1997

[54] ETCHING OF COPPER-CONTAINING DEVICES

[75] Inventors: Karrie J. Hanson, Westfield, N.J.; Barry Miller, Bratenahl, Ohio; Barbara J. Sapjeta, Parsippany, N.J.; Akshay V. Shah, Berkeley Heights, N.J.; Ken M. Takahashi, Warren, N.J.

[73] Assignee: Lucent Technologies Inc., Murray Hill, N.J.

[21] Appl. No.: 219,686

[22] Filed: Mar. 28, 1994

Related U.S. Application Data

[63] Continuation-in-part of Ser. No. 94,654, Jul. 19, 1993, Pat. No. 5,298,117.

[51] Int. Cl.$^6$ .............................. C23F 1/02; H01L 21/00
[52] U.S. Cl. .......................... 216/95; 252/79.3; 216/107
[58] Field of Search .................... 156/634.1, 656.1; 252/79.3

[56] References Cited

U.S. PATENT DOCUMENTS

| | | |
|---|---|---|
| 3,890,177 | 6/1975 | Pfahnl et al. . |
| 4,345,969 | 8/1982 | James et al. . |
| 4,900,398 | 2/1990 | Chen . |
| 5,017,271 | 5/1991 | Whewell et al. . |
| 5,049,234 | 9/1991 | Madhusudhan . |
| 5,248,386 | 9/1993 | Dastolfo, Jr. et al. . |
| 5,298,117 | 3/1994 | Hanson et al. .......................... 156/666 |

FOREIGN PATENT DOCUMENTS 209792   8/1990   Japan .

*Primary Examiner*—George Fourson
*Assistant Examiner*—C. Everhart
*Attorney, Agent, or Firm*—Bruce S. Schneider

[57] ABSTRACT

The linewidth in patterns produced by etching copper layers is more easily maintained using a specific etching medium. In particular, this medium includes aqueous hydrofluoric acid, copper chloride, and an additional chloride salt. The etching medium is also particularly useful for bilayer metal constructions such as the copper/titanium structure found in many multichip modules.

6 Claims, 1 Drawing Sheet

ETCHING OF COPPER-CONTAINING DEVICES

CROSS-REFERENCE TO RELATED APPLICATION

This application is a Continuation-in-Part of allowed U.S. application Ser. No. 08/094,654, filed Jul. 19, 1993, now U.S. Pat. 5,298,117 which is hereby incorporated by reference.

BACKGROUND OF THE INVENTION

1. Field of the Invention

This invention relates to devices having metallized regions and, in particular, to devices having copper metallized regions.

2. Art Background

A multitude of devices such as multichip modules, printed circuit boards, and hybrid integrated circuits include a patterned region of copper. A clear trend in the manufacture of such devices has been the use of progressively finer patterns, i.e., progressive decrease in metallized line dimension and the spaces between these lines. Presently, typical lines and spaces on printed circuit boards are 150 microns, 50–100 microns on ceramic substrates for multichip modules and at the micron level on silicon devices. The finer the lines and spaces, the greater the density of components and active elements.

The manufacture of devices with copper-containing electrical interconnects such as multichip modules and printed circuit boards is described in compendia such as *Thin Film Multichip Modules*, G. Messner et al., International Society for Hybrid Microelectronics, Reston, Va. (1992) and *Handbook of Printed Circuits*, R. Clark, Van Nostrand Reinhold, N.Y. (1985), respectively. For certain substrates such as silicon and ceramics, multilayer metallizations utilizing successive deposition of adhesion-promoting or diffusion barrier metals are required for the overall functioning of the interconnects. Such devices are formed in one approach by depositing a continuous layer or layers of metal, overlying this(ese) metal(s) with a mask such as a patterned polymer mask, and removing by etching the regions of the metal exposed through openings in the mask. A variety of etchants have been employed in this etching procedure. For example, aqueous hydrogen fluoride has been used for the etching of titanium layers, commonly employed as the underlaying bonding layer, while cupric chloride solutions, either containing hydrochloric acid or ammonia, primarily the latter, have been used for etching the thicker copper layers serving as the primary current-carrying component.

Although these solutions have been extensively used, problems still exist in their application as line spacings become smaller. Generally, these etchants rapidly remove material parallel to the substrate at rates comparable to the desired direction normal to the substrate surface. The starting condition is shown in FIG. 1, where 2 denominates the mask material, 3 denominates the metal and 1 denominates the substrate. With the described etchants, the material is removed rapidly towards the substrate and, due to lateral etching, is also etched under the mask material. As a result, configurations such as shown in FIG. 2, are obtained. Clearly, the greater the lateral etching, the larger and less advantageous is the minimum linewidth obtainable. Additionally, as a result of the rapid etch rate, reproducibility is substantially diminished and linewidth control is made more difficult. Thus, in general, it is desirable to produce an etching process which allows greater control with less undercutting.

The problem becomes even more critical when the metal structure to be etched includes a multiplicity of layers of different compositions. For example, metal patterns used in multichip modules to connect components often include an overlying layer of copper, together with an underlying metal layer such as a titanium layer, a palladium-doped titanium layer, or successive palladium and titanium layers. Even if adequate etchants are available for each individual layer, generally, an etchant for one or the other of the metals etches the two at such disparate rates that less than totally desirable results are achieved. Additionally, residues of one or more of the metals often are found in such circumstances. Palladium, interposed between Ti and Cu as metal or Ti—Pd alloy, is not removed by either HF or ammoniacal copper etchants.

For example, in a metallized region masked by material 14 and having an overlying copper 13 (in FIG. 3) layer and an underlying titanium layer 12, an ammoniacal cupric chloride solution is used to etch the copper, and an aqueous hydrogen fluoride etchant is used to etch the titanium. After the copper is fully cleared using the cupric chloride solution, etching of the titanium with aqueous hydrogen fluoride normally causes substantial undercutting of the titanium layer. Two sources of this undercutting include 1) the immunity of each metal to the other's etchant, thus requiring over-etching to assure complete removal in each step, and 2) formation of a passive oxide left by the copper etchant on the surface of the titanium, requiring an induction period to remove this layer, followed by rapid etch-through and concomitant titanium undercut. As a result, after copper etch, the configuration obtained is shown in FIG. 4, and after the titanium etch, the resulting configuration is shown in FIG. 5. The resulting large undercut in the metal bilayer is certainly not desirable and limits the density of line patterning and utility of the modules.

A few suggestions have been reported for etching metallized regions containing more than one metal layer. For example, as discussed in K. L. James, et al., U.S. Pat. No. 4,345,969, dated Aug. 24, 1982, and M. A. Spak, U.S. Pat. No. 4,220,706, dated Sep. 2, 1980, combinations including strongly oxidizing, concentrated inorganic acids have been employed. Nevertheless, the use of such combinations severely limits substrate and resist composition. It is desirable to have an etchant that allows increased resolution for producing copper lines and that promotes the controlled etching of multilayer metal regions. It would also be environmentally desirable to have an etchant for which recovery of copper and regeneration of used etchant with minimal waste disposal are feasible.

SUMMARY OF THE INVENTION

By using an aqueous cupric chloride solution including 1) an acid such as hydrofluoric acid, and 2) a chloride salt such as potassium chloride and/or hydrochloric acid, increased resolution for copper etching and reproducible control for the etching of multilayer metal regions such as copper/titanium and copper/palladium/titanium multilayer structures, is possible. This result is particularly surprising since an HF etchant, a hydrochloric acid etchant, or a cupric chloride etchant used individually, as previously discussed, yields unsatisfactory results.

Thus, through the use of a combined solution, etching rates of copper and titanium are adjusted to be quite similar and controllable, allowing the reproducible formation of multilayer metallized patterns with nearly vertical sidewalls for the combined multimetal structure. Unacceptable residues often associated with multilayer-metals such as palladium are not present. Additionally, the etchant solution is easily recycled.

DETAILED DESCRIPTION

Figure 1:
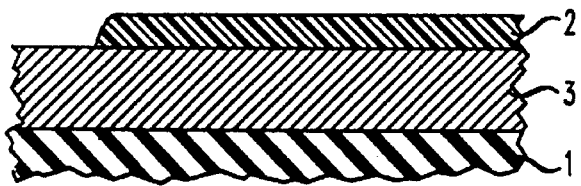
FIGS. 1–5 illustrate configurations achieved with single and multiple layer etching, and FIG. 6 demonstrates configurations and properties achieved with the subject invention.
Figure 2:
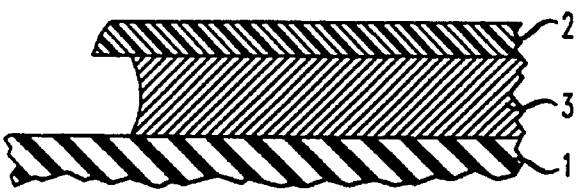
Figure 3:
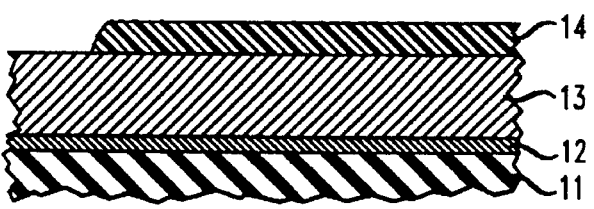
Figure 4:
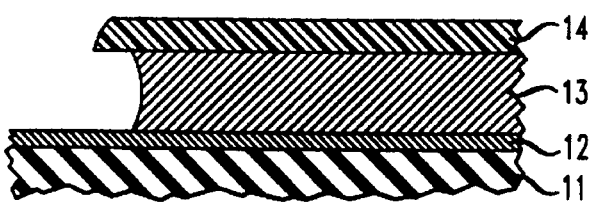
Figure 5:
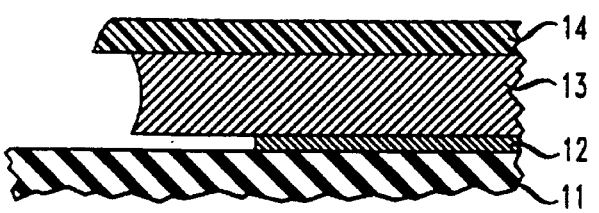
Figure 6:
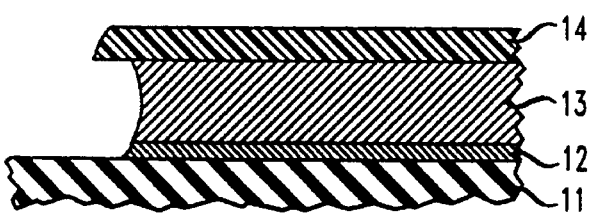

As discussed, an aqueous cupric chloride solution including 1) an acid such as hydrofluoric acid, and 2) a chloride salt and/or hydrochloric acid in addition to the cupric chloride is particularly advantageous for providing fine line copper structures and for etching multilayer copper structures without unacceptable undercut. Copper patterns are formed by a variety of etching techniques as described in compendia such as Clark, supra. The inventive etching process is generally employable in accordance with these techniques. Typically, a layer of the copper material is formed by conventional techniques such as sputtering or electroplating. In multilayer structures, typically a lower layer (lower or underlying, in the context of this invention, refers to a layer closer to the substrate), is first deposited by conventional techniques, and then the above-described overlying layer of copper is formed. To etch the pattern, the layer or layers of material to be etched are covered with an energy sensitive material such as a photoresist, the energy sensitive material is patterned to form an etch mask having the desired pattern, and etching is induced by contact with an etchant.

In such etching procedures, an aqueous solution is employed as the etchant. The etchant is introduced by conventional techniques such as immersing with agitation the substrate with its etch mask in the etchant, by spraying the etchant onto the substrate, or by other means of convective motion. Typically, the layer or layers to be etched are subjected to the etchant for time periods in the range 5 seconds to 10 minutes. Generally, time periods longer than 10 minutes are undesirable because of non-uniformity of results and slow process flow, while time periods shorter than 5 seconds lead variously to incomplete etching, irreproducibility, and excessive undercutting.

The composition of the etching solution should be controlled. The aqueous solution should contain cupric chloride. Concentrations in the range 0.2 to 2M of cupric chloride are generally employed. The rate of copper etching depends on the cupric species concentration, chloride concentration, and acid concentration. A source of chloride ion, i.e., a chloride salt and/or hydrochloric acid, is also used. The chloride salt (such as $NH_4Cl$, $NaCl$, $KCl$ and $LiCl$) should be soluble in the etchant mixture and should not chemically react with the etchant constituents. The concentration of chloride salt, the combination of such salt with hydrochloric acid, or hydrochloric acid alone (whichever is employed) in the aqueous etchant should be in the range 0.5 to 5M. Concentrations greater than 5M lead to solubility problems, while concentrations less than 1M yield slowed copper etching. If hydrochloric acid alone is used, it is advantageous to employ concentrations at the lower end of the range. Typically, chloride salts such as potassium chloride and sodium chloride are used. The mole ratio of source of chloride ion to cupric chloride should be in the range from 1:4 to 10:1.

The titanium layer is etched by the hydrofluoric acid component which is generally employed at concentrations of 0.5 to 10 weight % HF. The exact composition employed should be adjusted by corresponding adjustment of the relative concentration of the components so that the etch rate of the layers to be etched does not vary by more than a factor of two.

After etching, it is typically desirable to remove any residual presence of etchant by rinsing with water. Although such a rinse is generally employed as a precaution, by the use of the inventive process, residues such as palladium containing residues, are not present after etching and, thus, an advantageous, clean process is achievable.

The following examples are illustrative of the invention.

EXAMPLE 1

Sufficient cupric chloride, potassium chloride, and HF was added to water to make the resulting solution 0.66M in cupric copper, 1M in potassium chloride, and 2.1M in hydrofluoric acid. A substrate was prepared by depositing, over the entire major surface, a composite region of titanium and palladium having a thickness of 0.11 µm. An overlying copper layer was deposited with a thickness of 2.5 µm. (The substrate was either an alumina ceramic or an alumina ceramic coated with a layer of dielectric polymer.) A conventional photoresist was deposited onto the copper, exposed in a test pattern, and developed by conventional techniques. Etching was then initiated by spraying the delineated substrate with the etching solution for 35 seconds using an array of nozzles with the substrate held in a vertical position. The resist material was then removed using a standard resist stripper and the resulting pattern inspected.

The copper undercut was calculated by subtracting the measured linewidth from the linewidth delineated in the photoresist, and averaged 7.4 µm, plus or minus 1.8 µm over 69 measurements. (Linewidth was measured using optical microscopy.) This undercut was approximately equivalent to that generally observed for conventional processes.

The titanium undercut was also measured by first removing the overlying copper layer with an alkaline copper etch which did not attack the underlying titanium layer. The undercut in the exposed titanium layer, was calculated by subtracting the measured width of the titanium line from the previous measurement width of the copper line, and was essentially zero, i.e., —0.6 µm, plus or minus 0.8 µm averaged over 69 measurements. This undercut is extremely good compared to the 5.8 µm, plus or minus 3.4 µm, observed with the same process using sequential etches of ammoniacal cupric chloride for the copper and aqueous HF for the titanium. Additionally, no residues were visible nor was any leakage current detectable by an ohmmeter.

EXAMPLE 2

Sufficient cupric chloride, HCl, and HF was added to water to make the resulting solution 0.4M in cupric copper, 1M in HCl, and 0.7M in hydrofluoric acid. A substrate was prepared by depositing, over the entire major surface, a composite region of titanium and palladium having a thickness of 0.3 µm. An overlying copper layer was deposited with a thickness of 5 µm. (The substrate was either an alumina ceramic or an alumina ceramic coated with a layer of dielectric polymer.) A conventional photoresist was deposited onto the copper, exposed in a test pattern, and developed by conventional techniques. Etching was then initiated by spraying the delineated substrate with the etching solution for 120 seconds using an array of nozzles with the substrate held in a horizontal position. The resist material was then removed using a standard resist stripper and the resulting pattern inspected.

The copper undercut was calculated by subtracting the measured linewidth from the linewidth delineated in the photoresist, and averaged 7.4 μm, plus or minus 1.6 μm over 14 measurements. (Linewidth was measured using optical microscopy.) This undercut was approximately equivalent to that generally observed for conventional processes.

The titanium undercut was also measured by first removing the overlying copper layer with an alkaline copper etch which did not attack the underlying titanium layer. The undercut in the exposed titanium layer, was calculated by subtracting the measured width of the titanium line from the previous measurement width of the copper line, and was essentially zero i.e., −0.8 μm, plus or minus 1.8 μm averaged over 13 measurements. This undercut is extremely good compared to the 5.8 μm, plus or minus 3.4 μm, observed with the same process using sequential etches of ammoniacal cupric chloride for the copper and aqueous HF for the titanium. Additionally, no residues were visible nor was any leakage current detectable by an ohmmeter.

We claim:

1. A process for fabricating a substrate having metallic electrical interconnects, wherein said interconnects comprise a first metal overlying a second metal, said process comprising the steps of etching a region comprising a first layer of said first metal overlying a second layer of said second metal characterized in that both said first and second layers are etched using a solution comprising HF, cupric chloride, and hydrochloric acid.

2. The process of claim 1 wherein said first metal comprises copper.

3. The process of claim 2 wherein said second metal comprises titanium.

4. The process of claim 3 wherein said second metal includes palladium.

5. The process of claim 1 wherein said second metal comprises titanium.

6. The process of claim 5 wherein said second metal includes palladium.

* * * * *